United States Patent
Clark

(10) Patent No.: US 8,450,710 B2
(45) Date of Patent: May 28, 2013

(54) LOW TEMPERATURE P+ SILICON JUNCTION MATERIAL FOR A NON-VOLATILE MEMORY DEVICE

(75) Inventor: Mark Harold Clark, Santa Clara, CA (US)

(73) Assignee: Crossbar, Inc., Santa Clara, CA (US)

( * ) Notice: Subject to any disclaimer, the term of this patent is extended or adjusted under 35 U.S.C. 154(b) by 53 days.

(21) Appl. No.: 13/118,258

(22) Filed: May 27, 2011

(65) Prior Publication Data

US 2012/0298947 A1    Nov. 29, 2012

(51) Int. Cl.
*H01L 29/02* (2006.01)

(52) U.S. Cl.
USPC ..... 257/2; 257/3; 257/4; 257/5; 257/E29.002; 438/102; 438/103; 438/104; 365/163

(58) Field of Classification Search
USPC .... 257/2–5, E29.002; 438/102–104; 365/163
See application file for complete search history.

(56) References Cited

U.S. PATENT DOCUMENTS

| | | |
|---|---|---|
| 680,652 A | 8/1901 | Elden |
| 4,433,468 A | 2/1984 | Kawamata |
| 4,684,972 A | 8/1987 | Owen et al. |
| 4,741,601 A | 5/1988 | Saito |
| 5,242,855 A | 9/1993 | Oguro |
| 5,278,085 A | 1/1994 | Maddox, III et al. |
| 5,315,131 A | 5/1994 | Kishimoto et al. |
| 5,335,219 A | 8/1994 | Ovshinsky et al. |
| 5,360,981 A | 11/1994 | Owen et al. |
| 5,457,649 A | 10/1995 | Eichman et al. |
| 5,538,564 A | 7/1996 | Kaschmitter |
| 5,541,869 A | 7/1996 | Rose et al. |
| 5,594,363 A | 1/1997 | Freeman et al. |
| 5,614,756 A | 3/1997 | Forouhi et al. |
| 5,714,416 A | 2/1998 | Eichman et al. |
| 5,751,012 A | 5/1998 | Wolstenholme et al. |
| 5,840,608 A | 11/1998 | Chang |
| 5,970,332 A | 10/1999 | Pruijmboom et al. |
| 5,998,244 A | 12/1999 | Wolstenholme et al. |
| 6,128,214 A | 10/2000 | Kuekes et al. |
| 6,143,642 A | 11/2000 | Sur, Jr. et al. |
| 6,259,116 B1 | 7/2001 | Shannon |

(Continued)

FOREIGN PATENT DOCUMENTS

| KR | 1020110014248 A | 2/2011 |
|---|---|---|
| WO | WO 2009/005699 A1 | 1/2009 |

OTHER PUBLICATIONS

Jian Hu et al., "Area-Dependent Switching in Thin Film-Silicon Devices", Materials Research Society, Mal. Res. Soc. Symp Proc., 2003, pp. A18.3.1-A18.3.6, vol. 762.

(Continued)

*Primary Examiner* — Jami M Valentine
(74) *Attorney, Agent, or Firm* — Ogawa P.C.

(57) ABSTRACT

A method for forming a non-volatile memory device includes forming a dielectric material overlying a semiconductor substrate, forming a first wiring structure overlying the first dielectric material, depositing an undoped amorphous silicon layer, depositing an aluminum layer over the amorphous silicon layer at a temperature of about 450 Degrees Celsius or lower, annealing the amorphous silicon and aluminum at a temperature of about 450 Degrees Celsius or lower to form a p+ polycrystalline layer, depositing a resistive switching material comprising an amorphous silicon material overlying the polycrystalline silicon material, forming a second wiring structure comprising a metal material overlying the resistive switching material.

30 Claims, 6 Drawing Sheets

U.S. PATENT DOCUMENTS

| | | |
|---|---|---|
| 6,291,836 B1 | 9/2001 | Kramer et al. |
| 6,436,765 B1 | 8/2002 | Liou et al. |
| 6,436,818 B1 | 8/2002 | Hu et al. |
| 6,492,694 B2 | 12/2002 | Noble et al. |
| 6,768,157 B2 | 7/2004 | Krieger et al. |
| 6,815,286 B2 | 11/2004 | Krieger et al. |
| 6,838,720 B2 | 1/2005 | Krieger et al. |
| 6,858,481 B2 | 2/2005 | Krieger et al. |
| 6,858,482 B2 | 2/2005 | Gilton |
| 6,864,127 B2 | 3/2005 | Yamazaki et al. |
| 6,864,522 B2 | 3/2005 | Krieger et al. |
| 6,927,430 B2 | 8/2005 | Hsu |
| 6,939,787 B2 | 9/2005 | Ohtake et al. |
| 6,946,719 B2 | 9/2005 | Petti et al. |
| 7,020,006 B2 | 3/2006 | Chevallier et al. |
| 7,023,093 B2 | 4/2006 | Canaperi et al. |
| 7,026,702 B2 | 4/2006 | Krieger et al. |
| 7,102,150 B2 | 9/2006 | Harshfield et al. |
| 7,122,853 B1 | 10/2006 | Gaun et al. |
| 7,187,577 B1 | 3/2007 | Wang et al. |
| 7,221,599 B1 | 5/2007 | Gaun et al. |
| 7,238,607 B2 | 7/2007 | Dunton et al. |
| 7,254,053 B2 | 8/2007 | Krieger et al. |
| 7,289,353 B2 | 10/2007 | Spitzer et al. |
| 7,365,411 B2 | 4/2008 | Campbell |
| 7,405,418 B2 | 7/2008 | Happ et al. |
| 7,426,128 B2 | 9/2008 | Scheuerlein |
| 7,433,253 B2 | 10/2008 | Gogl et al. |
| 7,474,000 B2 | 1/2009 | Scheuerlein et al. |
| 7,479,650 B2 | 1/2009 | Gilton |
| 7,521,705 B2 | 4/2009 | Liu |
| 7,534,625 B2 | 5/2009 | Karpov et al. |
| 7,550,380 B2 | 6/2009 | Elkins et al. |
| 7,606,059 B2 | 10/2009 | Toda |
| 7,615,439 B1 | 11/2009 | Schricker et al. |
| 7,728,318 B2 | 6/2010 | Raghuram et al. |
| 7,729,158 B2 | 6/2010 | Toda et al. |
| 7,772,581 B2 | 8/2010 | Lung |
| 7,778,063 B2 | 8/2010 | Brubaker et al. |
| 7,786,464 B2 | 8/2010 | Nirschl et al. |
| 7,786,589 B2 | 8/2010 | Matsunaga et al. |
| 7,824,956 B2 | 11/2010 | Schricker et al. |
| 7,829,875 B2 | 11/2010 | Scheuerlein |
| 7,835,170 B2 | 11/2010 | Bertin et al. |
| 7,859,884 B2 | 12/2010 | Scheuerlein |
| 7,875,871 B2 | 1/2011 | Kumar et al. |
| 7,881,097 B2 | 2/2011 | Hosomi et al. |
| 7,897,953 B2 | 3/2011 | Liu |
| 7,898,838 B2 | 3/2011 | Chen et al. |
| 7,920,412 B2 | 4/2011 | Hosotani et al. |
| 7,924,138 B2 | 4/2011 | Kinoshita et al. |
| 7,968,419 B2 | 6/2011 | Li et al. |
| 8,004,882 B2 | 8/2011 | Katti et al. |
| 8,018,760 B2 | 9/2011 | Muraoka et al. |
| 8,045,364 B2 | 10/2011 | Schloss et al. |
| 8,054,674 B2 | 11/2011 | Tamai et al. |
| 8,067,815 B2 | 11/2011 | Chien et al. |
| 8,071,972 B2 | 12/2011 | Lu et al. |
| 8,088,688 B1 * | 1/2012 | Herner ............ 438/658 |
| 8,097,874 B2 | 1/2012 | Venkatasamy et al. |
| 8,102,698 B2 | 1/2012 | Scheuerlein |
| 8,143,092 B2 | 3/2012 | Kumar et al. |
| 8,144,498 B2 | 3/2012 | Kumar et al. |
| 8,164,948 B2 | 4/2012 | Katti et al. |
| 8,168,506 B2 | 5/2012 | Herner |
| 8,183,553 B2 | 5/2012 | Phatak et al. |
| 8,207,064 B2 | 6/2012 | Bandyopadhyay et al. |
| 8,227,787 B2 | 7/2012 | Kumar et al. |
| 8,233,308 B2 | 7/2012 | Schricker et al. |
| 8,237,146 B2 | 8/2012 | Kreupl et al. |
| 8,394,670 B2 | 3/2013 | Herner |
| 2004/0026682 A1 | 2/2004 | Jiang |
| 2005/0020510 A1 | 1/2005 | Benedict |
| 2005/0029587 A1 | 2/2005 | Harshfield |
| 2007/0008773 A1 | 1/2007 | Scheuerlein |
| 2007/0015348 A1 | 1/2007 | Hsu et al. |
| 2007/0087508 A1 | 4/2007 | Herner |
| 2007/0105284 A1 | 5/2007 | Herner |
| 2007/0105390 A1 | 5/2007 | Oh |
| 2007/0205510 A1 | 9/2007 | Lavoie et al. |
| 2007/0290186 A1 | 12/2007 | Bourim et al. |
| 2008/0002481 A1 | 1/2008 | Gogl et al. |
| 2008/0006907 A1 | 1/2008 | Lee et al. |
| 2008/0048164 A1 | 2/2008 | Odagawa |
| 2008/0089110 A1 | 4/2008 | Robinett et al. |
| 2008/0090337 A1 | 4/2008 | Williams |
| 2008/0106925 A1 | 5/2008 | Paz De Araujo et al. |
| 2008/0106926 A1 | 5/2008 | Brubaker et al. |
| 2008/0206931 A1 | 8/2008 | Breuil et al. |
| 2009/0001345 A1 | 1/2009 | Schricker et al. |
| 2009/0014707 A1 | 1/2009 | Lu et al. |
| 2009/0052226 A1 | 2/2009 | Lee et al. |
| 2009/0168486 A1 | 7/2009 | Kumar |
| 2009/0231910 A1 | 9/2009 | Liu et al. |
| 2009/0250787 A1 | 10/2009 | Kutsunai |
| 2009/0256130 A1 | 10/2009 | Schricker |
| 2009/0257265 A1 | 10/2009 | Chen et al. |
| 2009/0298224 A1 | 12/2009 | Lowrey |
| 2009/0321789 A1 | 12/2009 | Wang et al. |
| 2010/0012914 A1 | 1/2010 | Xu et al. |
| 2010/0019310 A1 | 1/2010 | Sakamoto |
| 2010/0032638 A1 | 2/2010 | Xu |
| 2010/0084625 A1 | 4/2010 | Wicker et al. |
| 2010/0085798 A1 | 4/2010 | Lu et al. |
| 2010/0090192 A1 | 4/2010 | Goux et al. |
| 2010/0101290 A1 | 4/2010 | Bertolotto |
| 2010/0102290 A1 | 4/2010 | Lu et al. |
| 2010/0157651 A1 | 6/2010 | Kumar et al. |
| 2010/0157710 A1 | 6/2010 | Lambertson et al. |
| 2010/0176368 A1 | 7/2010 | Ko et al. |
| 2010/0219510 A1 | 9/2010 | Scheuerlein et al. |
| 2010/0321095 A1 | 12/2010 | Mikawa et al. |
| 2011/0133149 A1 | 6/2011 | Sonehara |
| 2011/0155991 A1 | 6/2011 | Chen |
| 2011/0198557 A1 | 8/2011 | Rajendran et al. |
| 2011/0212616 A1 | 9/2011 | Seidel et al. |
| 2011/0227028 A1 | 9/2011 | Sekar et al. |
| 2011/0284814 A1 | 11/2011 | Zhang |
| 2011/0317470 A1 | 12/2011 | Lu et al. |
| 2012/0008366 A1 | 1/2012 | Lu |
| 2012/0012806 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | Delucca et al. |
| 2012/0043519 A1 | 2/2012 | Jo et al. |
| 2012/0043654 A1 | 2/2012 | Lu et al. |
| 2012/0104351 A1 | 5/2012 | Wei et al. |
| 2012/0145984 A1 | 6/2012 | Rabkin et al. |
| 2012/0155146 A1 | 6/2012 | Ueda et al. |
| 2012/0235112 A1 | 9/2012 | Huo et al. |

OTHER PUBLICATIONS

André Dehon, "Array-Based Architecture for FET-Based, Nanoscale Electronics", IEEE Transactions on Nanotechnology, Mar. 2003, pp. 23-32, vol. 2, No. 1, IEEE.

Herb Goronkin et al., "High-Performance Emerging Solid-State Memory Technologies", MRS Bulletin, www.mrs.org/publications/bulletin, Nov. 2004, pp. 805-813.

Gerhard Muller et al., "Status and Outlook of Emerging Nonvolatile Memory Technologies", IEEE, 2004, pp. 567-570.

A.E. Owen et al., "Memory Switching in Amorphous Silicon Devices", Journal of Non-Crystalline Solids 59 & 60, 1983, pp. 1273-1280, North Holland Publishing Company/Physical Society of Japan.

J. Campbell Scott, "Is There an Immortal Memory?", www.sciencemag.org, Apr. 2, 2004, pp. 62-63, vol. 304 No. 5667, American Association for the Advancement of Science.

S.H. Lee et al., "Full Integration and Cell Characteristics for 64Mb Nonvolatile PRAM", 2004 Symposium on VLSI Technology Digest of Technical Papers, IEEE, 2004, pp. 20-21.

Stephen Y. Chou et al., "Imprint Lithography With 25-Nanometer Resolution", Science, Apr. 5, 1996, pp. 85-87, vol. 272, American Association for the Advancement of Science.

S. Zankovych et al., "Nanoimprint Lithography: challenges and prospects", Nanotechnology, 2001, pp. 91-95, vol. 12, Institute of Physics Publishing.

A. Avila et al., "Switching in coplanar amorphous hydrogenated silicon devices", Solid-State Electronics, 2000, pp. 17-27, vol. 44, Elsevier Science Ltd.

Jian Hu et al., "Switching and filament formation in hot-wire CVD p-type a-Si:H devices", Thin Solid Films, Science Direct, www.sciencedirect.com, 2003, pp. 249-252, vol. 430, Elsevier Science B.V.

S. Hudgens et al., "Overview of Phase-Change Chalcogenide Nonvolatile Memory Technology", MRS Bulletin, www.mrs.org/publications/bulletin, Nov. 2004, pp. 829-832.

K. Terabe et al., "Quantized conductance atomic switch", Nature, www.nature.com/nature, Jan. 6, 2005, pp. 47-50, vol. 433, Nature Publishing Group.

Michael Kund et al., "Conductive bridging RAM (CBRAM): An emerging non-volatile memory technology scalable to sub 20nm", IEEE, 2005.

W. Den Boer, "Threshold switching in hydrogenated amorphous silicon", Appl. Phys. Letter, 1982, pp. 812-813, vol. 40, American Institute of Physics.

P.G. Lecomber et al., "The Switching Mechanism in Amorphous Silicon Junctions", Journal of Non-Crystalline Solids, 1985, pp. 1373-1382, vol. 77 & 78, Elsevier Science Publishers B.V., North Holland Physics Publishing Division, North-Holland, Amsterdam.

A. E. Owen et al., "Switching in amorphous devices", Int. J. Electronics, 1992, pp. 897-906, vol. 73, No. 5, Taylor and Francis Ltd.

M. Jafar et al., "Switching in amorphous-silicon devices", Physical Review B, May 15, 1994, pp. 611-615, vol. 49, No. 19, The American Physical Society.

Alexandra Stikeman, "Polymer Memory—The plastic path to better data storage", Technology Review, www.technologyreview.com, Sep. 2002, pp. 31.

Yong Chen et al., "Nanoscale molecular-switch crossbar circuits", Nanotechnology, 2003, pp. 462-468, vol. 14, Institute of Physics Publishing Ltd.

C. P. Collier et al., "Electronically Configurable Molecular-Based Logic Gates", Science Jul. 16, 1999, pp. 391-395, vol. 285, No. 5426, American Association for the Advancement of Science.

Office Action for U.S. Appl. No. 11/875,541 dated Jul. 22, 2010.
Office Action for U.S. Appl. No. 11/875,541 dated Mar. 30, 2011.
Office Action for U.S. Appl. No. 11/875,541 dated Oct. 5, 2011.
Office Action for U.S. Appl. No. 11/875,541 dated Jun. 8, 2012.

Jang Wook Choi, "Bistable [2]Rotaxane Based Molecular Electronics: Fundamentals and Applications", Dissertation, Chapter 3, <http://resolver.caltech.edu/CaltechETD:etd-05242007-194737> 2007, pp. 79-120, California Institute of Technology, Pasadena.

Sung-Hyun Jo et al., "A Silicon-Based Crossbar Ultra-High-Density Non-Volatile Memory", SSEL Annual Report 2007.

International Search Report for PCT/US2009/060023 filed on Oct. 8, 2009.

Rainer Waser et al., "Nanoionics-based resistive switching memories", Nature Materials, Nov. 2007, pp. 833-835, vol. 6, Nature Publishing Group.

Written Opinion of the International Searching Authority for PCT/US2009/060023 filed on Oct. 8, 2009.

Ex parte Quayle Action for U.S. Appl. No. 12/826,653 dated May 8, 2012.

International Search Report for PCT/US2011/040090 filed on Jun. 10, 2011.

Written Opinion of the International Searching Authority for PCT/US2011/040090 filed on Jun. 10, 2011.

Notice of Allowance for U.S. Appl. No. 13/158,231 dated Apr. 17, 2012.

Office Action for U.S. Appl. No. 12/835,704 dated Sep. 21, 2011.
Office Action for U.S. Appl. No. 12/835,704 dated Mar. 1, 2012.
Advisory Action for U.S. Appl. No. 12/835,704 dated Jun. 8, 2012.

International Search Report and Written Opinion for PCT/US2011/046035 filed on Jul. 29, 2011.

Office Action for U.S. Appl. No. 12/861,650 dated Jan. 25, 2012.
Notice of Allowance for U.S. Appl. No. 12/861,650 dated Jun. 19, 2012.

Sung Hyun Jo et al., "Programmable Resistance Switching in Nanoscale Two-Terminal Devices," Supporting Information, Dec. 29, 2008, pp. 1-4, vol. 9., No. 1, Department of Electrical Engineering and Computer Science, The University of Michigan, Ann Arbor, Michigan.

Kuk-Hwan Kim et al., "Nanoscale resistive memory with intrinsic diode characteristics and long endurance," Applied Physics Letters, 2010, pp. 053106-1-053106-3, vol. 96, American Institute of Physics.

Sung Hyun Jo et al., "Si-Based Two-Terminal Resistive Switching Nonvolatile Memory", IEEE, 2008.

Sung Hyun Jo et al., "Nanoscale Memristor Device as Synapse in Neuromorphic Systems", Nano Letters, 10, 1297-1301, 2010, pubs.acs.org/NanoLett, A-E, American Chemical Society Publications.

Wei Lu et al., "Nanoelectronics from the bottom up", Nature Materials, www.nature.com/naturematerials, Nov. 2007, pp. 841-850, vol. 6, Nature Publishing Group.

Sung Hyun Jo et al., "Ag/a-Si:H/c-Si Resistive Switching Nonvolatile Memory Devices", Nanotechnology Materials and Devices Conference, IEEE, 2006, pp. 116-117, vol. 1.

Sung Hyun Jo et al., "Experimental, Modeling and Simulation Studies of Nanoscale Resistance Switching Devices", $9^{th}$ Conference on Nanotechnology, IEEE, 2009, pp. 493-495.

Sung Hyun Jo et al., "Nonvolatile Resistive Switching Devices Based on Nanoscale Metal/Amorphous Silicon/Crystalline Silicon Junctions", Mater. Res. Soc. Symp. Proc., 2007, vol. 997, Materials Research Society.

Sung Hyun Jo et al., "Si Memristive Devices Applied to Memory and Neuromorphic Circuits", Proceedings of 2010 IEEE International Symposium on Circuits and Systems, 2010, pp. 13-16.

Wei Lu et al., "Supporting Information", 2008.

Sung Hyun Jo et al., "High-Density Crossbar Arrays Based on a Si Memristive System", Nano Letters, 2009, pp. 870-874, vol. 9 No. 2, American Chemical Society Publications.

Sung Hyun Jo et al., "High-Density Crossbar Arrays Based on a Si Memristive System", Supporting Information, 2009, pp. 1-4.

Sung Hyun Jo et al., "Programmable Resistance Switching in Nanoscale Two-Terminal Devices", Nano Letters, 2009, pp. 496-500, vol. 9 No. 1, American Chemical Society Publications.

Shubhra Gangopadhyay et al., "Memory Switching in Sputtered Hydrogenated Amorphous Silicon (a-Si:H)", Japanese Journal of Applied Physics, Short Notes, 1985, pp. 1363-1364, vol. 24 No. 10.

S. K. Dey, "Electrothermal model of switching in amorphous silicon films", J. Vac. Sci. Technol., Jan./Feb. 1980, pp. 445-448, vol. 17, No. 1, American Vacuum Society.

J. Hajto et al., "The Programmability of Amorphous Silicon Analogue Memory Elements", Mat. Res. Soc. Symp. Proc., 1990, pp. 405-410, vol. 192, Materials Research Society.

M. J. Rose et al., "Amorphous Silicon Analogue Memory Devices", Journal of Non-Crystalline Solids, 1989, pp. 168-170, vol. 115, Elsevier Science Publishers B.V., North-Holland.

A. Moopenn et al., "Programmable Synaptic Devices for Electronic Neural Nets", Control and Computers, 1990, pp. 37-41, vol. 18 No. 2.

P.G. Le Comber, "Present and Future Applications of Amorphous Silicon and Its Alloys", Journal of Non-Crystalline Solids, 1989, pp. 1-13, vol. 115, Elsevier Science Publishers B.V., North-Holland.

J. Hu, et al., "AC Characteristics of $Cr/p^+a$-Si:H/V Analog Switching Devices", IEEE Transactions on Electron Devices, Sep. 2000, pp. 1751-1757, vol. 47 No. 9, IEEE.

A.E. Owen et al., "New amorphous-silicon electrically programmable nonvolatile switching device", Solid-State and Electron Devices, IEEE Proceedings, Apr. 1982, pp. 51-54, vol. 129, Pt. I., No. 2.

J. Hajto et al., "Amorphous & Microcrystalline Semiconductor Devices: vol. 2, Materials and Device Physics", Mar. 1, 2004, pp. 640-700, Artech House Publishers.

J. Hajto et al., "Analogue memory and ballistic electron effects in metal-amorphous silicon structures", Philosophical Magazine B, 1991, pp. 349-369, vol. 63 No. 1, Taylor & Francis Ltd.

A. J. Holmes et al., "Design of Analogue Synapse Circuits using Non-Volatile a-Si:H Memory Devices", Proceedings of ISCAS, 1994, pp. 351-354.

Yajie Dong et al., "Si/a-Si Core/Shell Nanowires as Nonvolatile Crossbar Switches", Nano Letters, Jan. 2008, pp. 386-391, vol. 8 No. 2, American Chemical Society.

European Search Report for Application No. EP 09 81 9890.6 of Mar. 27, 2012.
D. A. Muller et al., "The Electronic structure at the atomic scale of ultrathin gate oxides", Nature, Jun. 24, 1999, pp. 758-761, vol. 399.
J. Suñé et al., "Nondestructive multiple breakdown events in very thin SiO$_2$ films", Applied Physics Letters, 1989, pp. 128-130, vol. 55.
Herve Marand et al., MESc. 5025 lecture notes: Chapter 7. Diffusion, University of Vermont, http://www.files.chem.vt.edu/chem-dept/marand/MEScchap6-1c.pdf.
A. E. Owen et al., "Electronic Switching in Amorphous Silicon Devices: Properties of the Conducting Filament", Proceedings of 5th International Conference on Solid-State and Integrated Circuit Technology, IEEE, 1998, pp. 830-833.
Sung Hyun Jo, "Nanoscale Memristive Devices for Memory and Logic Applications", Ph. D dissertation, University of Michigan, 2010.
Office Action for U.S. Appl. No. 12/894,098 dated Aug. 1, 2012.
Sung Hyun Jo et al., "CMOS Compatible Nanoscale Nonvolatile Resistance Switching Memory", Nano Letters, 2008, pp. 392-397, vol. 8, No. 2.
Office Action for U.S. Appl. No. 12/582,086 dated Apr. 19, 2011.
Office Action for U.S. Appl. No. 12/582,086 dated Sep. 6, 2011.
Notice of Allowance for U.S. Appl. No. 12/582,086 dated Oct. 21, 2011.
International Search Report for PCT/US2009/061249 filed on Oct. 20, 2009.
Written Opinion of the International Searching Authority for PCT/US2009/061249 filed on Oct. 20, 2009.
Office Action for U.S. Appl. No. 12/861,650 dated Oct 16, 2012.
Notice of Allowance for U.S. Appl. No. 12/894,087 dated Oct. 25, 2012.
Office Action for U.S. Appl. No. 12/814,410 dated Apr. 17, 2012.
Office Action for U.S. Appl. No. 12/835,699 dated Aug. 24, 2011.
Notice of Allowance for U.S. Appl. No. 12/835,699 dated Feb. 6, 2012.
Office Action for U.S. Appl. No. 12/833,898 dated Apr. 5, 2012.
European Search Report for Application No. EP 1100 5207.3 of Oct. 12, 2011.
Notice of Allowance for U.S. Appl. No. 12/833,898 dated May 30, 2012.
Notice of Allowance for U.S. Appl. No. 12/939,824 dated May 11, 2012.
Notice of Allowance for U.S. Appl. No. 12/940,920 dated Oct. 5, 2011.
Office Action for U.S. Appl. No. 13/314,513 dated Mar. 27, 2012.
Shong Yin, "Solution Processed Silver Sulfide Thin Films for Filament Memory Applications", Technical Report No. UCB/EECS-2010-166, http://www.eecs.berkeley.edu/Pubs/TechRpts/2010/EECS-2010-166.html, Dec. 17, 2010, Electrical Engineering and Computer Sciences, University of California at Berkeley.
Office Action for U.S. Appl. No. 13/149,653 dated Apr. 25, 2012.
International Search Report for PCT/US2011/045124 filed on Jul. 22, 2011.
Written Opinion of the International Searching Authority for PCT/US2011/045124 filed on Jul. 22, 2011.
Peng-Heng Chang et al., "Aluminum spiking at contact windows in Al/Ti-W/Si", Appl. Phys. Lett., Jan. 25, 1988, pp. 272-274, vol. 52 No. 4, American Institute of Physics.
J. Del Alamo et al., "Operating Limits of Al-Alloyed High-Low Junctions for BSF Solar Cells", Solid-State Electronics, 1981, pp. 415-420, vol. 24, Pergamon Press Ltd., Great Britain.
Hao-Chih Yuan et al., "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.
Notice of Allowance for U.S. Appl. No. 12/939,824 dated Jul. 24, 2012.
Office Action for Application No. EP 1100 5207.3 dated Aug. 8, 2012.
Office Action for U.S. Appl. No. 13/417,135 dated Oct. 9, 2012.
Notice of Allowance for U.S. Appl. No. 13/149,807 dated Oct. 29, 2012.
Notice of Allowance for U.S. Appl. No. 12/861,666 dated Nov. 14, 2012.
Office Action for U.S. Appl. No. 13/156,232, dated Nov. 26, 2012.
Notice of Allowance for U.S. Appl. No. 13/290,024 dated Nov. 28, 2012.
Notice of Allowance for U.S. Appl. No. 13/532,019 dated Nov. 14, 2012.
Office Action for U.S. Appl. No. 13/149,653 dated Nov. 20, 2012.
Office Action of U.S. Appl. No. 13/436,714 dated Dec. 7, 2012.
Notice of Allowance for U.S. Appl. No. 12/814,410, dated Jan. 8, 2013.
Corrected Notice of Allowance for U.S. Appl. No. 12/861,666, dated Jan. 11, 2013.
Supplemental Notice of Allowance for U.S. Appl. No. 12/894,087, dated Jan. 11, 2013.
Notice of Allowance for U.S. Appl. No. 13/314,513, dated Jan. 24, 2013.
Notice of Allowance for U.S. Appl. No. 13/118,258, dated Feb. 6, 2013.
International Search Report and Written Opinion for PCT/US2012/040242, filed May 31, 2012.
Office Action for U.S. Appl. No. 13/174,264, dated Mar. 6, 2013.
Office Action for U.S. Appl. No. 13/679,976, dated Mar. 6, 2013.
Notice of Allowance for U.S. Appl. No. 12/894,098, dated Mar. 15, 2013.
Office Action for U.S. Appl. No. 13/465,188, dated Mar. 19, 2013.
Office Action for U.S. Appl. No. 12/861,432 dated Mar. 29, 2013.
Notice of Allowance for U.S. Appl. No. 13/748,490, dated Apr. 9, 2013.

* cited by examiner

LOW TEMPERATURE P+ SILICON JUNCTION MATERIAL FOR A NON-VOLATILE MEMORY DEVICE

BACKGROUND

The present invention is generally related to resistive switching devices. More particularly, embodiments according to the present invention provide a method to form a low temperature crystalline silicon material for a resistive switching device. Embodiments according to the present invention can be applied to non-volatile memory devices but it should be recognized that the present invention can have a much broader range of applicability.

The success of semiconductor devices has been mainly driven by an intensive transistor down-scaling process. However, as field effect transistors (FET) approach sizes less than 100 nm, problems such as the short channel effect degrade device performance. Moreover, such sub 100 nm device sizes can lead to sub-threshold slope non-scaling and increase in power dissipation. It is generally believed that transistor-based memories such as those commonly known as Flash may approach an end to scaling within a decade. Flash memory is one type of non-volatile memory device.

Other non-volatile random access memory (RAM) devices such as ferroelectric RAM (Fe RAM), magneto-resistive RAM (MRAM), organic RAM (ORAM), and phase change RAM (PCRAM), among others, have been explored as next generation memory devices. These devices often require new materials and device structures to couple with silicon-based devices to form a memory cell, which lack one or more key attributes. For example, Fe-RAM and MRAM devices have fast switching characteristics and good programming endurance, but their fabrication is not CMOS compatible and size is usually large. Switching a PCRAM device requires a large amount of power. Organic RAM or ORAM is incompatible with large volume silicon-based fabrication and device reliability is usually poor.

From the above, a new semiconductor device structure and integration is desirable.

BRIEF SUMMARY OF THE INVENTION

The present invention is generally related to resistive switching devices. More particularly, embodiments of the present invention provide a method to form a low temperature crystalline silicon material for a resistive switching device. Embodiments according to the present invention can be applied to non-volatile memory devices but it should be recognized that the present invention can have a much broader range of applicability.

In some embodiments, methods for forming a non-volatile memory device are provided. Methods use a low temperature process at temperatures ranging from 400 Degrees Celsius to 450 Degrees Celsius. The methods include providing a semiconductor substrate having a surface region and forming a first dielectric material overlying the surface region. A first wiring structure is then formed overlying the first dielectric material. In a specific embodiment, a silicon material having a substantially amorphous characteristic is formed overlying at least the first wiring structure. The silicon material is not intentionally doped in a specific embodiment. The methods include depositing an aluminum containing material overlying the silicon material at a temperature of less than about 450 Degrees Celsius. The methods then subject at least the aluminum containing material and the silicon material to an anneal process of less than about 450 Degrees Celsius to convert the silicon material having the substantially amorphous characteristic to a polycrystalline silicon material having a p+ impurity characteristic. In various embodiments, the p+ impurity characteristic is caused by an aluminum species derived from the aluminum containing material dissociating from a layer of aluminum containing material and occupying a site within a spatial region of the silicon material. In various embodiments, the aluminum species can occupy an interstitial site in the silicon material or can replace a silicon site. A resistive switching material comprising an amorphous silicon material is subsequently formed overlying the polycrystalline silicon material having the p+ impurity characteristic, and a second wiring structure comprising at least a metal material is formed overlying the resistive switching element. In a some embodiments, the methods form a resistive switching device from the first wiring structure, the polycrystalline silicon material having a p+ impurity characteristic, the resistive switching material comprising the amorphous silicon material, and the second wiring structure.

In a specific embodiment, a non-volatile memory device is provided. The device includes a substrate having a surface region and a first dielectric material overlying the surface region. The device includes a first wiring structure comprising a first conductive material overlying the first dielectric material. In a specific embodiment, the device includes a polycrystalline silicon material having a p+ impurity characteristic overlying the first wiring structure. In a preferred embodiment, the p+ impurity characteristic is provided by a aluminum species. The device includes a resistive switching material comprising an amorphous silicon material overlying the polycrystalline silicon material having the p+ impurity characteristic. The device includes a second wiring structure overlying the resistive switching material. In a specific embodiment, the second wiring structure includes at least a first portion and a second portion. The first portion of the second wiring structure includes at least an active metal material in physical and electric contact with the resistive switching material, and the second portion of the second wiring structure includes at least a second conductive material overlying the active metal material.

Many benefits can be achieved by ways of the present invention over conventional techniques. For example, the present method provides a low temperature process to form a polycrystalline silicon material for a buffer material for a non-volatile memory device. The polycrystalline silicon material is further doped with a suitable impurity species for a desirable conductivity characteristic. The low temperature process is compatible with current CMOS fabrication technology enabling the non-volatile memory device to be stacked vertically for a high density device in a specific embodiment. Additionally, embodiments according to the present invention use conventional semiconductor process techniques and equipment without modification. Various embodiments can include the integration of various circuitry along with the novel memory structures described herein, such as logic arrays, microprocessors, state machines, portable electronic devices, cell phones, computers, or the like. Depending upon the embodiment, one or more of these benefits may be achieved. One skilled in the art would recognize other modifications, variations, and alternatives.

DETAILED DESCRIPTION OF THE INVENTION

The present invention is generally related to resistive switching devices. More particularly, some embodiments according to the present invention provide a method for forming a low temperature crystalline silicon material for a resistive switching device. Various embodiments according to the present invention can be applied to non-volatile memory devices but it should be recognized that the present invention can have a much broader range of applicability.

Amorphous silicon (a-Si) based switching device has been studied in micrometer scale in the past. A typical conventional device consists of a pair of metal electrodes sandwiching an amorphous silicon material. The device fabrication may be compatible with CMOS processing technology. However, these conventional metal/a-Si/metal (M/a-Si/M) based devices require a high operating voltage (usually greater than about 10V) which is not fully controllable and thus reduces the device yield and endurance. Additionally, such devices may not be able to further scale down to nanometer scale as demanded by present application in consumer electronics.

The inventor of the present invention recognizes that to further decrease cost per bit, process simplification in addition to device shrinking is necessary. Various embodiments according to the present invention provide a low temperature method to form a polycrystalline silicon material and a resulting device structure for a non-volatile memory device having a desirable switching characteristic and device reliability.

Figure 1:
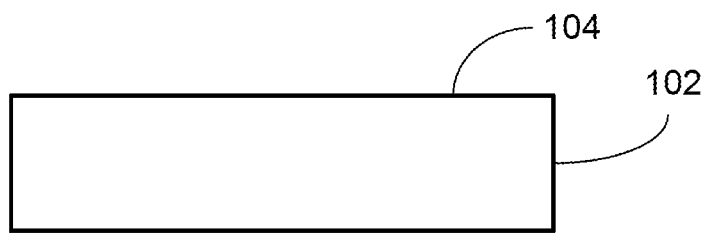
FIGS. 1-11 are simplified diagrams illustrating methods for forming non-volatile memory device according to embodiments of the present invention.

FIG. 1-11 are simplified diagrams illustrating methods for forming a resistive switching device for a non-volatile memory device according to various embodiments of the present invention. As shown in FIG. 1, a semiconductor substrate 102 having a surface region 104 is provided. The semiconductor substrate can be a single crystal silicon wafer, a silicon germanium material, a silicon on insulator (commonly called SOI), or the like, depending on the embodiment. In certain embodiments, the semiconductor substrate can have one or more MOS devices formed thereon. The one or more MOS devices can be controlling circuitry for the resistive switching device in a specific embodiment. In other embodiments, the one or more MOS devices may include other functionality, such as a processor, logic, or the like.

Figure 2:
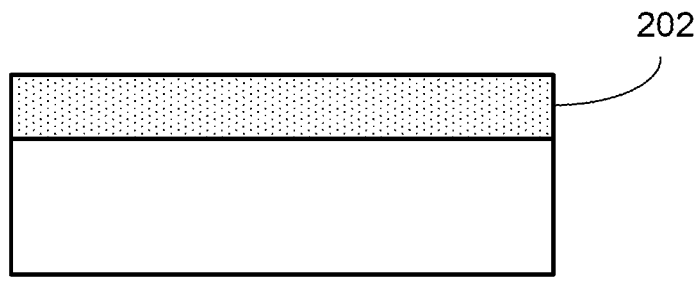

As illustrates in FIG. 2, the method includes depositing a first dielectric material 202 overlying the semiconductor substrate. First dielectric material 202 can be silicon oxide, silicon nitride, a dielectric stack of alternating layers of silicon oxide and silicon nitride (for example, an ONO stack), a low K dielectric, a high K dielectric, or a combination thereof, and others, depending on the application. In various embodiments, first dielectric material 202 can be deposited using conventional techniques such as chemical vapor deposition, including low pressure chemical vapor deposition, plasma enhanced chemical vapor deposition, atomic layer deposition (ALD), physical vapor deposition, including any combination of these, and others.

Figure 3:
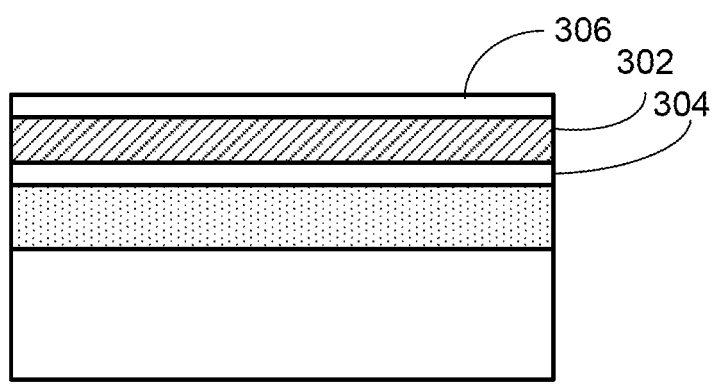

Referring to FIG. 3, the method includes depositing a first wiring material 302 overlying first dielectric material 202. First wiring material 302 can be a suitable metal material (including alloy materials), a suitable semiconductor material having a suitable conductivity characteristic, or the like. In various embodiments, a suitable metal material can include tungsten, aluminum, copper or silver, and others. These metal materials may be deposited using a physical vapor deposition process, chemical vapor deposition process, electroplating, or electrodeless deposition process, including any combinations of these, and others. In various embodiments, a suitable semiconductor material can be, for example, a suitably doped silicon material in certain embodiments. In certain embodiments, a first adhesion material 304 is first formed overlying first dielectric material 202 before deposition of first wiring material 302 to promote adhesion of first wiring material 302 to first dielectric material 202. Additionally, a diffusion barrier material 306 may also be formed overlying first wiring material 302 to prevent first wiring material 302 to contaminate other portions of the device in a specific embodiment.

Figure 4A:
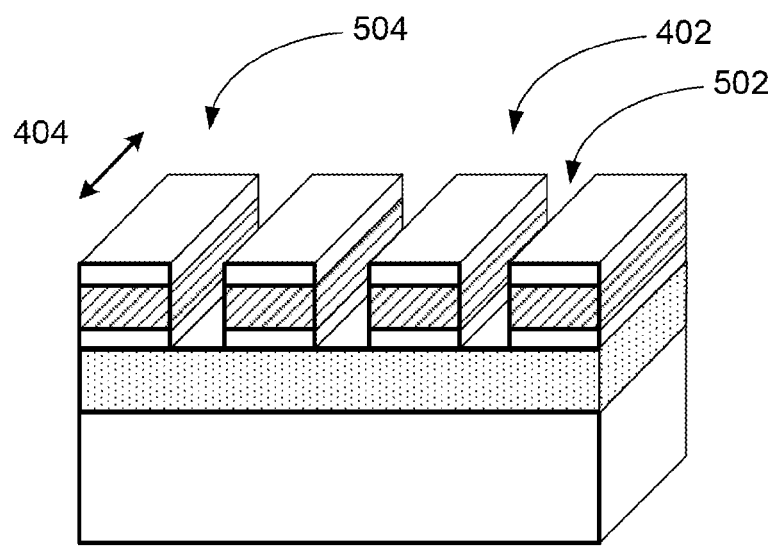

As illustrated in FIG. 4A, various embodiments of the method subjects first wiring material 302 (including first adhesion layer 304 and diffusion barrier material 306) to a first pattern and etching process to form a first wiring structure 402. As shown in the example in FIG. 4, first wiring structure 402 may include a first plurality of elongated structures that extend in a first planar direction 404.

Figure 4B:
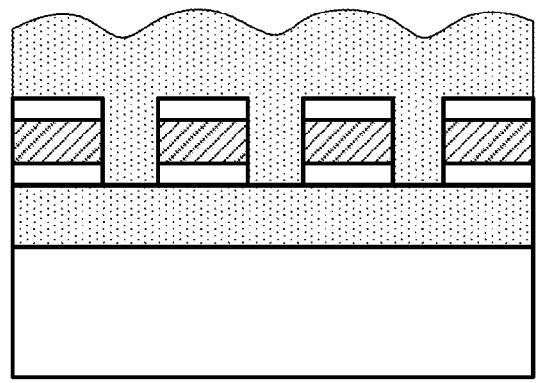
Figure 5:
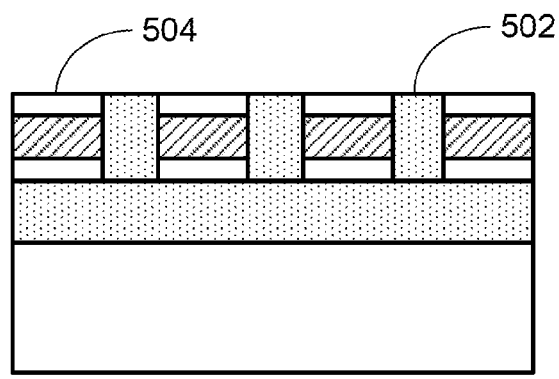

In various embodiments illustrated in FIG. 4B, the method includes depositing a second dielectric material 501 overlying first wiring structure 402 illustrated in FIG. 4A. second dielectric material 501 may include silicon oxide, silicon nitride, a dielectric stack of alternating layers of silicon oxide and silicon nitride (for example, an ONO stack), a low K dielectric, a high K dielectric, a combination thereof, and others, depending on the specific application. Subsequently, second dielectric material 501 is subjected to a planarizing process to isolate first wiring structures 402. As shown in FIG. 5, surface region 504 of the diffusion barrier material is exposed as a result of the planarization process.

Figure 6:
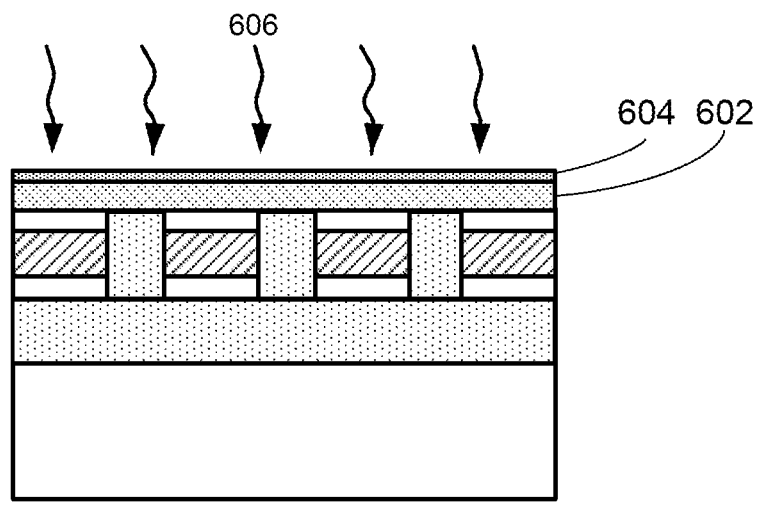

Referring to FIG. 6, in various embodiments, the method deposits a first silicon material 602 overlying the first wiring structure 402 and exposed surface regions of second dielectric material 501. The first silicon material can be deposited using conventional techniques such as a chemical vapor deposition process including low pressure chemical vapor deposition process, plasma-enhanced chemical vapor deposition process, using silicon precursor such as silane ($SiH_4$), disilane ($Si_2H_6$), or a chlorosilane in a suitable reducing environment depending on the embodiment, or the like. In some embodiments, first silicon material 602 is deposited at a deposition temperature ranging from about 380 Degree Celsius to about 450 Degree Celsius and preferably not greater than about 440 Degree Celsius. In some embodiments, first silicon material 602 can be deposited using a physical vapor deposition process from a suitable silicon target. In such embodiments, deposition temperature can range from about 380 Degree Celsius to about 450 Degree Celsius, and preferably not higher than 440 Degree Celsius. In some embodiments, first silicon material 602 is deposited using a low pressure chemical vapor deposition process using disilane at a deposition temperature ranging from about 400 Degree Celsius to about 460 Degree Celsius. The inventor believes that at this range of deposition temperatures, first silicon material 602 is non-crystalline or amorphous.

Next, in various embodiments, an aluminum containing material 604 is deposited overlying first silicon material 602. In some embodiments, the aluminum containing material may be deposited using a physical vapor process using a suitable aluminum target material. In other embodiments, the aluminum containing material may be deposited by a chemical vapor deposition process using precursors such as trimethyl aluminum (TMA) or dimethyl aluminum hydride (DMAH) usually in a hydrogen atmosphere. Other suitable precursors may also be used depending on the application. In various embodiments, the deposition temperature can range from about 150 Degree Celsius to about 300 Degree Celsius depending on the precursors and deposition pressure used.

Figure 6A:
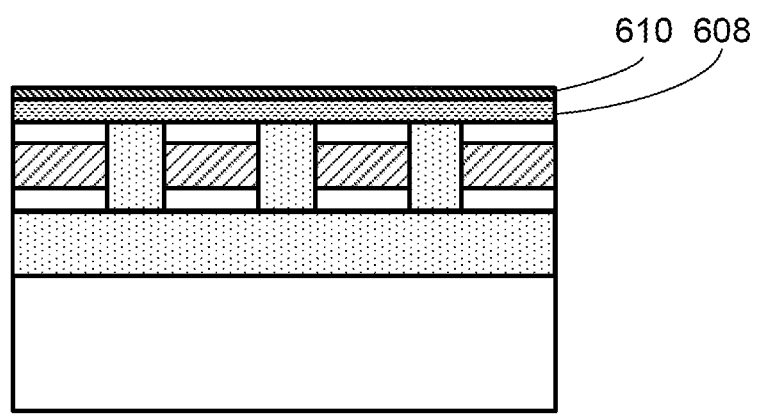

In various embodiments, the method subjects first silicon material 602 and aluminum containing material 604 to an anneal process 606. The anneal process is characterized by an anneal temperature and an anneal time. In some embodiments, the anneal temperature ranges from about 350 Degree Celsius to about 400 Degree Celsius. Further, the anneal time can range from about 45 minutes to about 90 minutes depending on the anneal temperature. As illustrated in FIG. 6A, the inventor believes that at an anneal temperature of no greater than about 400 Degree Celsius, aluminum containing material 604 causes a portion of first silicon material 602 to crystallize to form a polycrystalline silicon material 610. In various embodiments, as a result of the anneal process, aluminum containing material 604 causes polycrystalline silicon material 610 to have a p+ impurity characteristic. In some embodiments, polycrystalline silicon 610 having the p+ impurity characteristic has a thickness depending on a thickness of the aluminum containing material deposited. Additionally polycrystalline silicon material 610 having the p+ impurity characteristic has a desirable conductivity for a junction material for a non-volatile memory device in a specific embodiment.

Depending on the embodiment, polycrystalline silicon material 610 having the p+ impurity characteristic can form overlying an Al/Si composite material 608 also shown in FIG. 6A. Alternatively, Al/Si composite material 608 may not form depending on a relative thickness of the aluminum containing material and the first silicon material and depending upon the process parameter. In some embodiments, it may be desirable that Al/Si composite material 608 does not form or is kept to a minimum.

In some embodiments, an aluminum containing material can be first deposited followed by the first silicon material. In such cases, after the anneal process, the Al/Si composited material described above would be formed overlying the polycrystalline silicon material having the p+ impurity characteristic, also described above. Subsequently, the Al/Si composite material can be removed by an etching process. In various embodiments, the etching process can be a time etch process or an end-point etch (as the Al/Si material and the polycrystalline silicon material having the p+ impurity characteristic have different etch rates). Of course there can be other modifications, variations, and alternatives.

Figure 7:
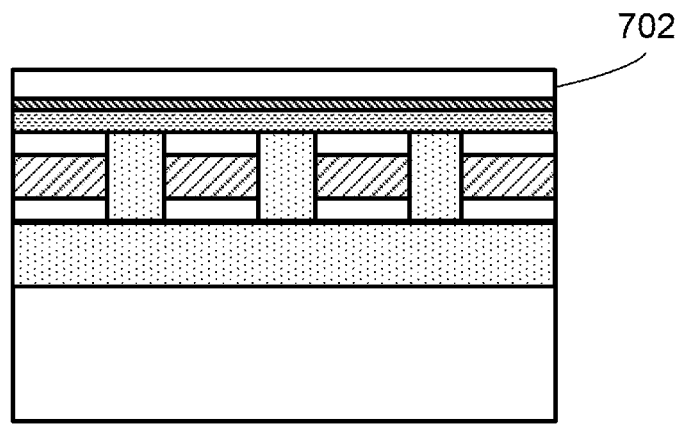

Referring to FIG. 7, in various embodiments, the method deposits a resistive switching material 702 overlying the polycrystalline silicon material 610. The resistive switching material can be a second silicon material, such as an amorphous silicon material, a polycrystalline silicon material, or the like. In various embodiments, resistive switching material 702 comprises an amorphous silicon material that may be deposited using deposition techniques such as a chemical vapor deposition process CVD), physical vapor deposition (PVD) process, an atomic layer deposition (ALD) process, or the like. In various embodiments, a chemical vapor process can be a low pressure chemical vapor deposition process, plasma enhanced chemical vapor deposition process, deposited using precursors such as silane, disilane, a suitable chlorosilane in a reducing environment, combinations thereof, and others. The deposition temperature can range from 250 Degree Celsius to about 500 Degree Celsius. In some embodiments, the deposition temperature ranges from about 400 Degree Celsius to about 440 Degree Celsius. In some cases, the deposition temperature may be desired to be less than about 450 Degree Celsius.

Figure 8:
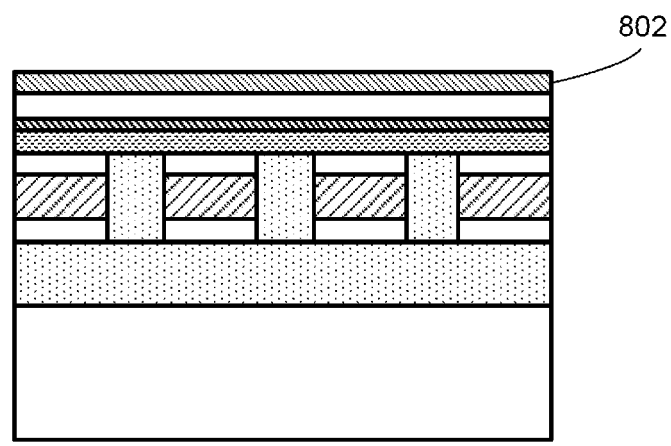

As shown in FIG. 8, in some embodiments, the method includes depositing a second conductive material 802 overlying resistive switching material 702. The second conductive material can be a metal material such as copper, silver, gold, platinum, palladium, nickel, zinc or others. In some embodiments, second metal material 802 is characterized by a suitable diffusivity in resistive switching material 702 in a presence of an electric field. In cases where amorphous silicon material is used for resistive switching material 702, second metal material 802 can be silver, an alloy of silver, or the like. In specific embodiments, the alloy of silver comprises at least 80 percent of silver.

In various embodiments, when second metal material 802 includes silver or silver alloy and resistive switching material includes amorphous silicon 702, the silver material forms a silver region in a portion of the amorphous silicon material when an electric field is applied across second metal material 802 and resistive switching material 702. The silver region is believed to include a plurality of silver particles, including silver ions, silver clusters, silver atoms, and combinations thereof. In various embodiments, the plurality of silver particles are believed to be located in defect sites of the amorphous silicon material. In some embodiments, the silver region further includes one or more silver filament structures that extend from second metal material 802 down towards first wiring structure 402. Various characterizations of the filament structure(s) may be made, such as a filament length, a distance between the silver particles, a distance between the filament structure and the first electrode structure, and the like. In various embodiments, resistive switching material 702 (for example, the amorphous silicon material) may be characterized by a resistance. Further, the resistance of resistive switching material 702 may depend on a filament length, a distance between the silver particles, a distance between the filament structure and the first electrode structure, and the like. In various embodiments, the polycrystalline silicon material 610 (junction layer) is used to control an interfacial property for proper switching behavior of resistive switching device 702.

As illustrated in FIG. 8, in some embodiments, the method can deposit additional layer(s) 804 including an adhesion material and/or a diffusion barrier material overlying second metal material 802. In some embodiments, the adhesion material can include titanium such as, titanium nitride, titanium tungsten, tantalum nitride, and others depending on the application. The adhesion material and the diffusion barrier material can be deposited using a chemical vapor deposition process, a physical vapor deposition process, atomic, including a combination of these, and others.

Figure 9:
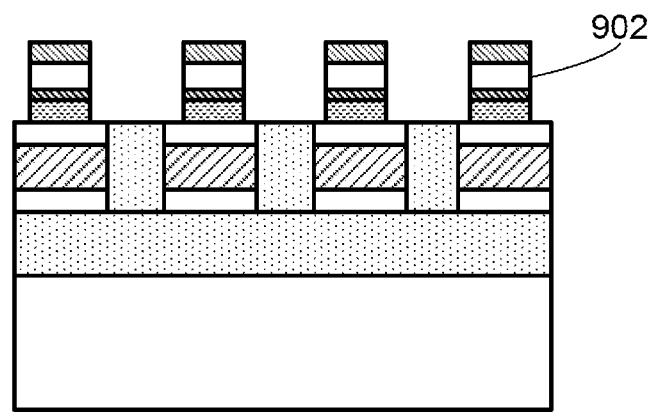

In some embodiments of the present invention, the method subjects the junction material including Al/Si composite material 608, if present, and polycrystalline silicon material 610 (having the p+ impurity characteristic can) resistive switching material 702, second metal material 802, including additional layers 804 (the adhesion material and the diffusion barrier material) to a pattern and etching process to form one or more pillar structures 902 overlying first wiring structure 402 as shown in FIG. 9. In various embodiments, pillar structures 902 are substantially aligned with surface region 504 and also extend in the first planar direction 404.

Figure 10A:
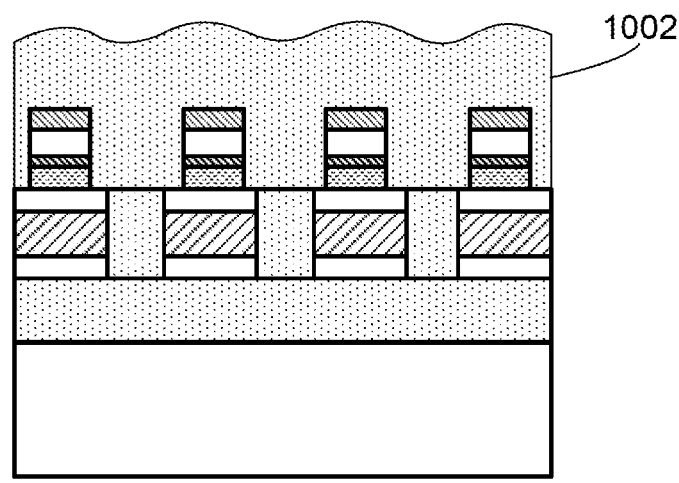

In various embodiments, a third dielectric material 1002 is then deposited overlying the one or more pillar structures 902 and fills gaps between the pillar structures to isolate pillar structures 902, as shown in FIG. 10A. In various embodiment, the third dielectric material 1002 may include silicon oxide, silicon nitride, a dielectric stack comprising alternative layers of silicon oxide and silicon nitride (for example, an ONO), a high K dielectric, a low K dielectric, or a combination, and others depending on the application.

Figure 10B:
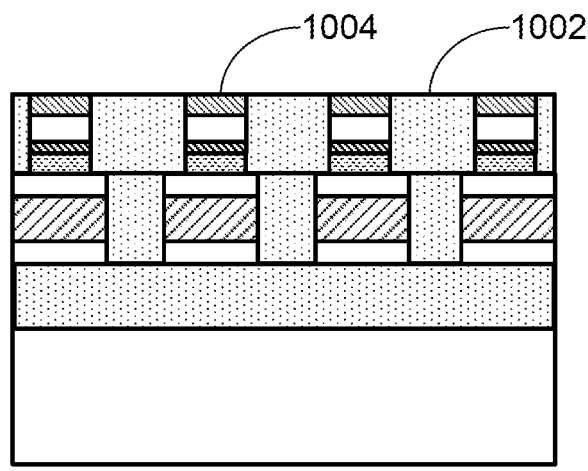

Subsequently, as illustrated in FIG. 10B, the third dielectric material 1002 is subjected to a planarizing process to expose a top surface region 1004 of additional layers 804 (e.g. the diffusion barrier material). In various embodiments, the planarizing process can be a chemical and/or mechanical polishing process using the diffusion barrier material as a polish stop layer; an etch back process; or a combination of etch back process and chemical mechanical polishing process.

Figure 11:
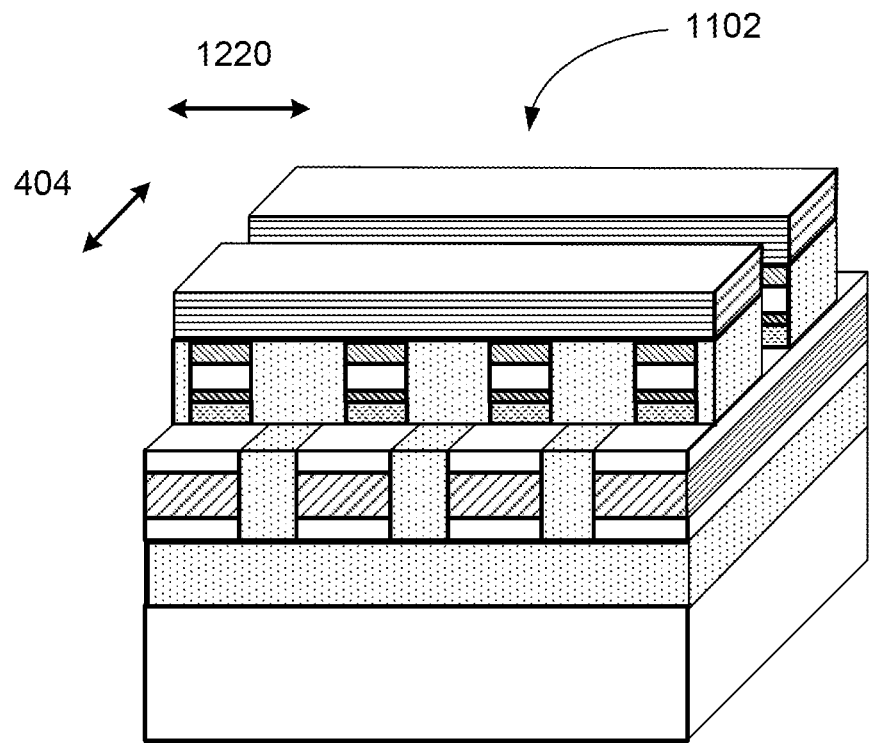

As shown in FIG. 11, in various embodiments, the method may include depositing a second wiring material 1102 overlying the one or more pillar structures and third dielectric material 1002, or the like illustrated in FIG. 10B. The second wiring material 1102 can include aluminum, copper, tungsten, silver, a semiconductor material having a suitable conductivity, or the like, as discussed for first wiring material 402. In some embodiments, second wiring material 1102 may include at least one overlying adhesion material and/or diffusion barrier material. For example, a titanium layer can be formed/deposited overlying the pillar structure and the third dielectric material structure illustrated in FIG. 10B, and titanium nitride layer can formed/deposited overlying the titanium layer as an adhesion/diffusion barrier material.

In various embodiments, second wiring material 1102 (including adhesion/barrier material) is subjected to a pattern and etch process to form a second wiring structure 1216. In various embodiments, the second wiring structure 1216 is elongated in shape and spatially configured to extend in a second planar direction 1220. The second planar direction 1220 is at an angle to the first planar direction 440 of first wiring structure 420. In some embodiments, second planar direction 1220 is orthogonal to first direction 404, although in other embodiments the angle may be set to other angles, such as 45 degrees, 30 degrees, or the like. In various embodiments, the method then deposits a third dielectric material 1300 overlying second wiring structure 1216, to isolate each of the second wiring structures 1216, as illustrated in FIG. 13. In various embodiments, writable and readable memories are then formed at the intersection (crossing) of first wiring structure 420 (e.g. nano wires) and second wiring structure 1216 (e.g. nano wires). Crossbar-type memory elements are thus formed.

Subsequently, one or more passivation layers, global wiring structures, interconnects and others structures may deposited or formed upon the structure illustrated in FIG. 13 depending on the application. For example, circuitry associated with a microprocessor processor, programmable logic array or device, state machine, or the like may be formed. In other examples, circuitry associated with a microprocessor processor, programmable logic array or device, state machine, or the like may be formed prior to deposition of first dielectric material 202, or the like.

Again, depending on the specific application, there can be other variations. For example, the first wiring material, the junction material, and the resistive switching material can be patterned and etched as a stack to reduce deposition of the first wiring material on a sidewall region of the resistive switching material during etching. As an example, a suitable dielectric material can be deposited over the resulting structure including a thickness overlying the resistive switching material. An opening is then formed in a portion of the dielectric material to expose a surface of the resistive switching material. In various embodiments, the active material is formed at least in the opening region in contact with the resistive switching material. Next, the second wiring structure is formed overlying the active switching material.

Figure 12:
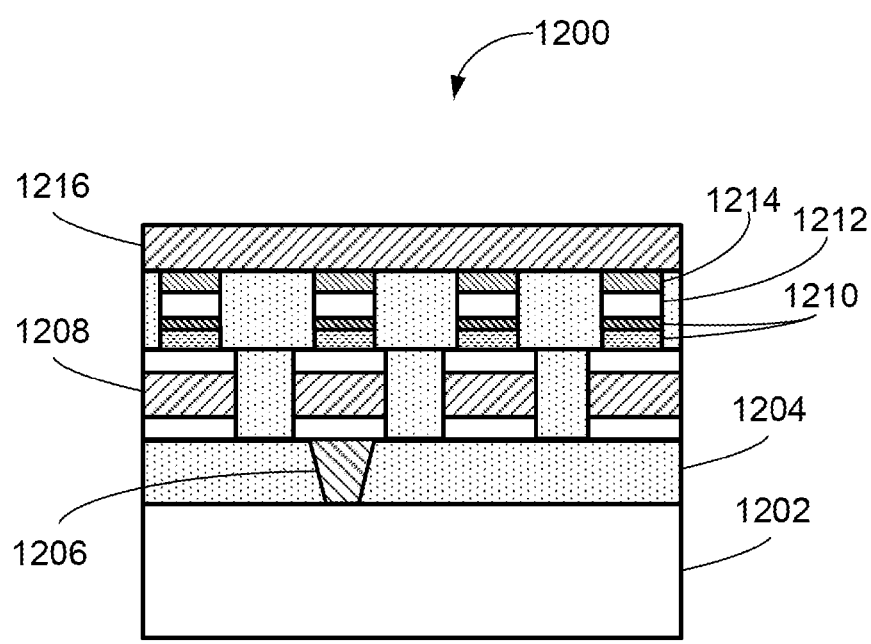
FIG. 12 is a simplified diagram illustrating a non-volatile memory device according to embodiments of the present invention.

In some embodiments, a non-volatile memory device structure 1200 is provided as illustrated in FIG. 12, the device includes a substrate 1202 having a surface region. The substrate can be a semiconductor material such as single crystal silicon, silicon on insulator (SOI), silicon germanium, or other suitable semiconductor material. In some embodiments, the substrate can include one or more CMOS device formed thereon. The one or more CMOS devices can include one or more control transistors for the non-volatile memory device, for a separate processor, logic device, logic array, or the like, in some embodiments.

As illustrated in FIG. 12, the device includes a first dielectric material 1204 overlying the surface region of the substrate and a conductor plug structure 1206 in a portion of the first dielectric material. In some embodiments, the conductor plug structure 1206 electrically connect the underlying CMOS devices, if any, to selected non-volatile memory devices in a specific embodiment. In FIG. 12, the device includes a first wiring structure 1208 overlying the first dielectric material. In various embodiments, the first wiring structure is elongated in shape and configured to spatially extend in a first direction. The device includes a junction material 1210 overlying the first wiring structure and a resistive switching material 1212 overlying the junction material. In a specific embodiment, the junction material includes a polycrystalline silicon material having a p+ impurity characteristic. The p+ impurity characteristic is provided by an aluminum containing material species occupying a spatial site of the polycrystalline silicon material in a specific embodiment. The polycrystalline silicon material having a p+ impurity characteristic is formed at a process temperature compatible with CMOS fabrication in a specific embodiment. In some embodiments, the process temperature includes a deposition temperature no greater than about 450 Degree Celsius and an anneal temperature no greater than about 450 Degree Celsius. In a specific embodiment, the anneal temperature can range from about 380 Degree Celsius to about 395 Degree Celsius. The resistive switching material can be an amorphous silicon material in a specific embodiment. The amorphous silicon material may not be doped and essentially intrinsic in a specific embodiment.

In FIG. 12, the resistive switching material forms one or more resistive switching elements 1212. In various embodiments, the device includes an active metal material 1214 in electrical and physical contact with the resistive switching material. In some examples, the active metal material may be selected from silver, gold, platinum, palladium, nickel, aluminum, copper, and other suitable materials. The active metal material is typically characterized by a diffusivity into the resistive switching material upon application of an applied electric field in a specific embodiments. In some embodiments, the active metal material is silver when the resistive switching material is amorphous silicon material.

As shown in FIG. 12, the device includes a second wiring structure 1216 overlying at least the active metal material. The second wiring structure is elongated in shape and spatially configured to extend in a second direction (e.g. orthogonal to the first direction) in a specific embodiment. Depending on the application, the first wiring structure and the second wiring structure can be fabricated from a suitable conductor material such as copper, tungsten, aluminum, or a suitable doped semiconductor material, including any combinations of these, and others. As previously discussed, the first wiring structure and the second wiring structure may also include one or more adhesion material and diffusion barrier material to prevent contamination of the device depending on the application.

In various embodiments, as the memory devices describe herein are small compared to standard memories, a processor, or the like, may include greater amounts of memory (cache) on the same semiconductor device. As such memories are relatively non-volatile, the states of such processors, or the like may be maintained while power is not supplied to the processors. To a user, such capability would greatly enhance the power-on power-off performance of devices including such processors. Additionally, such capability would greatly reduce the power consumption of devices including such processors. In particular, because such memories are non-volatile the processor need not draw power to refresh the memory states, as is common with CMOS type memories.

It is also understood that the examples and embodiments described herein are for illustrative purposes only and that various modifications or alternatives in light thereof will be suggested to persons skilled in the art and are to be included within the spirit and purview of this application and scope of the appended claims.

What is claimed is:

1. A method for forming a non-volatile memory device using a low temperature process, the low temperature ranging from about 400 Degrees Celsius to about 450 Degrees Celsius, comprising:
   providing a semiconductor substrate having a surface region;
   forming a first dielectric material overlying the surface region;
   forming a first wiring structure overlying the first dielectric material;
   depositing a first silicon material having a substantially amorphous characteristic overlying at least the first wiring structure, the first silicon material being substantially undoped;
   depositing an aluminum containing material overlying the first silicon material at a deposition temperature of about 450 Degrees Celsius or lower;
   subjecting at least the aluminum containing material and the first silicon material to an anneal process at an anneal temperature of about 450 Degrees Celsius or lower to convert at least a portion of the first silicon material to a polycrystalline silicon material having a p+ impurity characteristic, wherein the p+ impurity characteristic is caused by an aluminum species from the aluminum containing material occupying a site within a spatial region of the first silicon material;
   depositing a resistive switching material comprising an amorphous silicon material overlying the polycrystalline silicon material; and
   forming a second wiring structure comprising a metal material overlying the resistive switching material,
   wherein a resistive switching device includes at least the first wiring structure, the polycrystalline silicon material, the resistive switching material, and the second wiring structure.

2. The method of claim 1 wherein the polycrystalline silicon material is associated with a second thickness that is associated with a first thickness of the aluminum containing material.

3. The method of claim 1 wherein the first silicon material is deposited using a chemical vapor deposition process at a deposition temperature ranging from about 380 Degree Celsius to about 450 Degree Celsius using at least disilane ($Si_2H_6$) as a precursor.

4. The method of claim 1 wherein the first silicon material is formed by a physical vapor deposition process at a deposition temperature ranging from about 380 Degree Celsius to about 450 Degree Celsius using a silicon target material.

5. The method of claim 1 wherein the first silicon material is non-crystalline.

6. The method of claim 1 wherein the anneal process is associated with an anneal temperature ranging from about 360 Degree Celsius to about 450 Degree Celsius and with an anneal time ranging from about 30 minutes to about 80 minutes.

7. The method of claim 1 wherein the aluminum containing material and the portion of the first silicon layer form the polycrystalline silicon material are annealed at an anneal temperature ranging from about 360 Degree Celsius to about 450 Degree Celsius.

8. The method of claim 1 wherein another portion of the first silicon material and the aluminum containing material form an aluminum silicon composite material, wherein the polycrystalline silicon material overlies the aluminum silicon composite material.

9. The method of claim 1 wherein the semiconductor substrate is selected from a group consisting of: a single crystal silicon substrate, a silicon germanium substrate, or a silicon on insulator (SOI) substrate.

10. The method of claim 1 wherein the semiconductor substrate further comprises one or more transistor devices formed thereon, wherein the one or more transistor device comprises one or more controlling transistors coupled to the resistive switching device.

11. The method of claim 1 wherein the metal material is selected from a group consisting of: silver, silver compound, gold, gold compound, palladium, palladium compound, nickel, nickel compound, platinum, platinum compound, aluminum, aluminum compound.

12. The method of claim 1 wherein the metal material forms a metal region in a portion of the resistive material upon application of a positive voltage to the second wiring structure.

13. The method of claim 12 wherein the metal region comprises a filament structure characterized by a length, the filament structure having a length dependent on an operating voltage applied to the first wiring structure or the second wiring structure.

14. The method of claim 13 wherein the resistive switching material is characterized by a resistance dependent at least on the length of the filament structure.

15. The method of claim 1 wherein the first wiring structure is selected from a group consisting of: aluminum, aluminum compound, copper, copper compound, tungsten, tungsten compound, a doped semiconductor material.

16. The method of claim 1
   wherein the first wiring structure is elongated in shape and configured to spatially extend in a first direction,
   wherein the second wiring structure is elongated in shape and configured to spatially extend in a second direction,
   wherein the first direction and the second direction are oriented in a manner selected from a group consisting of: perpendicular, non-perpendicular, angled.

17. The method of claim 1 further comprises etching the polycrystalline silicon material, the amorphous silicon material, and the metal material to form a plurality of pillar structures.

18. The method of claim 17 further comprises:
   forming a layer of a second dielectric material overlying the plurality of pillar structures and filling gaps between the plurality of pillar structures;
   subjecting the layer of the second dielectric material to a planarizing process to expose a top surface of the plurality of pillar structures, depositing a second wiring material overlying the metal material and the second dielectric material; and etching the second wiring material to a third pattern to from a plurality of a second wiring structures extending in a second direction perpendicular to the first direction.

19. A method for forming a non-volatile memory device using a low temperature process, the low temperature process ranging from about 400 Degrees Celsius to about 450 Degrees Celsius, comprising:

providing a semiconductor substrate having a surface region;

forming a first dielectric material overlying the surface region;

forming a first wiring structure overlying a the first dielectric material;

depositing an aluminum containing material overlying a portion of the first dielectric material at a deposition temperature of less than about 450 Degrees Celsius;

depositing a first silicon material having a substantially amorphous characteristic overlying at least the aluminum containing material, the first silicon material being undoped;

annealing at least the aluminum containing material and the first silicon material at an anneal temperature of less than about 450 Degrees Celsius to convert the first silicon material having the substantially amorphous characteristic to a polycrystalline silicon material having a p+ impurity characteristic, the p+ impurity characteristic being in response to an aluminum species derived from the aluminum containing material dissociating from a layer of the aluminum containing material and occupying a site within a spatial region of the first silicon material, and to a composite material comprising aluminum and silicon overlying the polycrystalline silicon material having the p+ impurity characteristic;

selectively removing the composite material to thereby expose the polycrystalline silicon material having the p+ impurity characteristic;

depositing a resistive switching material comprising an amorphous silicon material overlying the polycrystalline silicon material having the p+ impurity characteristic; and forming a second wiring structure comprising at least a metal material overlying the resistive switching element.

20. The method of claim 19 wherein selectively removing the composite material comprises a process selected from a group consisting of: a selective dry etch process, a chemical mechanical polishing process.

21. A device, comprising:
a non-volatile memory device comprising:
a substrate having a surface region;
a first dielectric material overlying the surface region;
a first wiring structure comprising a first conductive material overlying the first dielectric material;
a polycrystalline silicon material having a p+ impurity characteristic overlying the first wiring structure, the p+ impurity characteristic being derived from a aluminum species occupying a site within a spatial region of the polycrystalline silicon material;
a resistive switching material comprising an amorphous silicon material overlying the polycrystalline silicon material having the p+ impurity characteristic; and
a second wiring structure overlying the resistive switching material, the second wiring structure comprising a first portion and a second portion, the first portion comprising at least an active metal material in physical and electric contact with the resistive switching material, and the second portion comprising at least a second conductive material overlying the active metal material; and
a driving circuit coupled to the non-volatile memory device configured to provide a voltage across the first wiring structure and the second wiring structure.

22. The device of claim 21 wherein the first wiring structure is elongated in shape and spatially configured to extend in a first direction and the second wiring structure is elongated in shape and spatially configured to extend in a second direction, the second direction being antiparallel to the first direction.

23. The device of claim 21 wherein the polycrystalline silicon material having the p+ impurity characteristic is formed at least by an anneal process at an anneal temperature ranging from about 360 Degree Celsius to about 390 Degree Celsius for a period of time ranging from about 30 minutes to about 80 minutes.

24. The device of claim 21 wherein the active metal material is selected from a group consisting of: silver, gold, palladium, nickel, platinum, aluminum, a combination of two or more of: silver, gold, palladium, nickel, platinum, aluminum.

25. The device of claim 21 wherein the polycrystalline silicon material having the p+ impurity characteristic forms a buffer layer between the amorphous silicon material and the first wiring structure to control a defect density in an interface region formed between the amorphous silicon material and the first wiring structure.

26. The device of claim 21 wherein the active metal material forms a metal region in a portion of the resistive material upon application of a positive voltage across the first wiring structure and second wiring structure.

27. The device of claim 26 wherein the metal region comprises a filament structure characterized by a length, the filament structure having a length dependent on the positive voltage applied across the first wiring structure and the second wiring structure.

28. The device of claim 21 wherein the resistive switching material is characterized by a resistance dependent at least on the length of the filament structure.

29. The device of claim 21 further comprising a processing unit coupled to the driving circuit and configured to provide data to the driving circuit.

30. A non-volatile memory device formed according to the process described in claim 1.

* * * * *